United States Patent
Stephens et al.

(10) Patent No.: US 8,946,914 B2
(45) Date of Patent: Feb. 3, 2015

(54) CONTACT POWER RAIL

(71) Applicants: Jason Eugene Stephens, Cohoes, NY (US); Marc L. Tarabbia, Pleasant Valley, NY (US); Nader Magdy Hindawy, Wappingers Falls, NY (US); Roderick Alan Augur, Hopewell Junction, NY (US)

(72) Inventors: Jason Eugene Stephens, Cohoes, NY (US); Marc L. Tarabbia, Pleasant Valley, NY (US); Nader Magdy Hindawy, Wappingers Falls, NY (US); Roderick Alan Augur, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/784,220

(22) Filed: Mar. 4, 2013

(65) Prior Publication Data

US 2014/0246791 A1 Sep. 4, 2014

(51) Int. Cl.
*H01L 21/768* (2006.01)
*H01L 23/528* (2006.01)

(52) U.S. Cl.
CPC ...... *H01L 21/76877* (2013.01); *H01L 23/5286* (2013.01)
USPC ............................ 257/786; 438/586; 716/126

(58) Field of Classification Search
CPC .................. H01L 2924/0002; H01L 2924/00; H01L 27/14603; H01L 27/14627; G06F 17/5068; G06F 17/5077
USPC .................. 716/126, 120, 127; 257/292, 773, 257/E27.133; 174/68.2
See application file for complete search history.

(56) References Cited

U.S. PATENT DOCUMENTS

| | | | | |
|---|---|---|---|---|
| 7,821,038 | B2 * | 10/2010 | Ko et al. ........................ | 257/207 |
| 8,437,166 | B1 * | 5/2013 | Huang et al. .................... | 365/72 |
| 2009/0193381 | A1 * | 7/2009 | Chuang .......................... | 716/12 |
| 2012/0018839 | A1 * | 1/2012 | Tsuda ........................... | 257/500 |

\* cited by examiner

*Primary Examiner* — David Vu
*Assistant Examiner* — Jonathan Han
(74) *Attorney, Agent, or Firm* — Ditthavong & Steiner, P.C.

(57) ABSTRACT

A method for forming CA power rails using a three mask decomposition process and the resulting device are provided. Embodiments include forming a horizontal diffusion CA power rail in an active layer of a semiconductor substrate using a first color mask; forming a plurality of vertical CAs in the active layer using second and third color masks, the vertical CAs connecting the CA power rail to at least one diffusion region on the semiconductor substrate, spaced from the CA power rail, wherein each pair of CAs formed by one of the second and third color masks are separated by at least two pitches.

13 Claims, 4 Drawing Sheets

CONTACT POWER RAIL

TECHNICAL FIELD

The present disclosure relates to semiconductor devices with integrated power rails. The present disclosure is particularly applicable to 14 nanometer technology nodes.

BACKGROUND

In general there are three different power rail options—a gate contact (CB) power rail, a metal layer (M1) power rail, or a source/drain contact (CA) power rail. The CB power rail as shown in FIG. 1 and the M1 power as shown in FIG. 2 are used extensively in 20 nanometer technology nodes. The CB power rail connects source and drain through CA to M1. Working up from the substrate (not shown for illustrative convenience) a CB power rail cell includes diffusion regions (RXs) 101 and 103, polysilicon gate electrodes (PCs) 105, gate cut regions (CTs) 107, CB power rails 109, 111, and 113, vertical CAs 115 and 117 connecting the CB power rails 109 and 111 with RXs 101 and 103, respectively; double patterned vias (R0s) 119, 121, and 123 connecting the CB power rails 109, 111, and 113 to M1, i.e. to the positive power rails (VDDs) 125 and 127 in M1 and to the negative power rail (VSS) 129, respectively. The principle advantage of the CB power rail is that the R0s 119 through 123 are connected throughout the CB power rails 109 through 113, and the resulting redundancy ensures connectivity. In addition, there are no lithography limitations since the CB power rails 109 through 113 are not connected to other CBs. However, the principle disadvantage of the CB power rail is that the width of the CTs 107 must be greater than the width of the CB power rails 109 through 113 to prevent CB from shorting to PC. For example, CTs 107 are 94 nm in width as depicted as opposed to a minimum width of 44 nm. A further disadvantage is that the CB power rail scheme reduces RX efficiency in the cell.

As shown in FIG. 2, the M1 power rail functions much like any CA-R0-M1 connection wherein the source and drain are connected to CA and then to M1 through R0. More specifically, the M1 power rail cell, working up from the substrate, includes RXs 201 and 203, PCs 205, CTs 207, vertical CAs 209 and 211 connecting the R0s 213 and 215 to the RXs 201 and 203, respectively, and VDDs 217 and 219 in M1 and VSS 221, also in M1. The principle advantages of the M1 power rail is that the width of CT can be minimized thereby increasing the RX efficiency of the cell. However, the principle disadvantages are that there is no R0 redundancy, and, therefore, if R0 fails, the whole node will be floating. Also, the R0 enclosure of CA, e.g., R0 213 and CA 209, pushes the tip of CA 209 past the center of the M1 power rail 217, for example, which creates CA same color (same mask) space violations and forces the CAs within the cells to be pushed towards the middle causing congestion.

A need therefore exists for methodology enabling fabrication with CA power rails, with R0 redundancy, and minimum CT width, and the resulting device.

SUMMARY

An aspect of the present disclosure is a method of forming CA power rails using a three mask decomposition process.

Another aspect of the present disclosure is a device including CA power rails formed with a first mask and a plurality of CAs formed using second and third masks.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a horizontal diffusion CA power rail in an active layer of a semiconductor substrate using a first color mask; forming a plurality of vertical CAs in the active layer using second and third color masks, the vertical CAs connecting the CA power rail to at least one diffusion region on the semiconductor substrate, spaced from the CA power rail, wherein each pair of CAs formed by one of the second and third color masks are separated by at least two pitches.

Aspects of the present disclosure include forming a horizontal M1 power rail in an M1 layer and forming a plurality of vias connecting the CA power rail to the M1 power rail. Other aspects include forming a plurality of vertical polysilicon gate electrodes in a polysilicon layer and forming a cut mask between the polysilicon gate electrodes and the CA power rail. Further aspects include forming vertical CAs on opposite sides of the CA power rail, wherein a first CA on one side of the CA power rail is formed by one of the second and third color masks, and a second CA, across the CA power rail from the first CA, is formed by the other of the second and third color masks. Additional aspects include forming the first and second CA, wherein the first and second CAs overlap the CA power rail and also each other. Another aspect includes forming a third CA two pitches away from the first CA and a fourth CA two pitches away from the second CA, with no CAs in between, wherein the third and fourth CAs are formed by the same color mask. Other aspects include forming a third CA on one side of the CA power rail by one of the second and third color masks, overlapping the CA power rail, and forming a fourth CA, across the CA power rail from the third CA, by the other of the second and third color masks, separated from the CA power rail.

Another aspect of the present disclosure is a device including: a semiconductor substrate, the semiconductor substrate including at least one diffusion region; an active layer including a horizontal diffusion CA power rail and a plurality of vertical CAs connecting the at least one diffusion region to the CA power rail; an M1 overlying the active layer, the M1 layer including a horizontal M1 power rail; and a plurality of vias connecting the CA power rail to the M1 power rail, wherein the horizontal CA power rail is formed using a first color mask and the plurality of vertical CAs are formed using second and third color masks. Aspects of the device include a polysilicon layer on the semiconductor substrate, the polysilicon layer including a plurality of vertical polysilicon gate electrodes and a cut mask between the polysilicon layer and the active layer. Other aspects include vertical CAs that are formed on opposite sides of the CA power rail. Further aspects include a first CA on one side of the CA power rail and formed by one of the second and third color masks, and a second CA across the power rail from the first CA and formed by the other of the second and third color masks. Additional aspects include the first and second CAs overlapping both the CA power rail and also each other. Another aspect includes a third CA formed two pitches away from the first CA and a fourth CA formed two pitches away from the second CA, with no CAs in between, wherein the third and fourth CAs are formed by the same color mask. Other aspects include a third CA formed by one of the second and third color masks on one side of the CA power rail, overlapping the CA power rail, and a fourth CA formed by the other of the second and third color masks across the CA power rail from the third CA, separated from the CA power rail.

Another aspect of the present disclosure is a method including: forming first and second horizontal RXs in an RX layer of a semiconductor substrate within a cell; forming a first, second, third, and fourth vertical PCs, evenly spaced in a PC layer of the semiconductor substrate; forming a horizontal VDD in M1 of the semiconductor substrate; forming a horizontal VSS in the M1 layer; forming first and second horizontal diffusion CA power rails in a CA layer of the semiconductor substrate, above VDD and VSS, respectively; forming a plurality of pairs of vertical CAs in the CA layer, each vertical CA attached to an RX region, evenly spaced between VDD and VSS; forming a plurality of R0s connecting the first and second horizontal CA power rails with the M1 layer, each R0 above a vertical PC and within a horizontal CA power rail; and forming a first and a second horizontal CT region between the PCs and the first and second horizontal CA power rails, respectively, wherein the horizontal CA power rails and the vertical CAs are decomposed into a first color mask and second and third color masks, respectively. Aspects include forming the first and second RX evenly spaced between VDD and VSS. Other aspects include forming vertical CAs on opposite sides of the CA power rail, wherein a first CA is formed on one side of the CA power rail by one of the second and third color masks, and a second CA is formed across the CA power rail from the first CA by the other of the second and third color masks. Further aspects include the first and second CAs overlapping both the CA power rail and each other. Additional aspects include forming a third CA two pitches away from the first CA and a fourth CA two pitches away from the second CA, with no CAs in between, wherein the third and fourth CAs are formed by the same color mask. Another aspect includes forming a third CA by one of the second and third color masks on one side of a CA power rail, overlapping the CA power rail, and forming a fourth CA by the other of the second and third color masks across from the third CA, separated from the CA power rail.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of wide CT requirements attendant upon patterning 14 and 20 nanometer technology CB power rails, a lack of R0 redundancy and cell congestion attendant upon patterning 14 and 20 nanometer technology M1 power rails, and CA lithographic patterning issues attendant upon patterning 20 nanometer technology CA power rails.

Methodology in accordance with embodiments of the present disclosure includes forming a horizontal diffusion CA power rail in an active layer of a semiconductor substrate using a first color mask. A plurality of vertical CAs are formed in the active layer using second and third color masks, the vertical CAs connecting the CA power rail to at least one diffusion region on the semiconductor substrate, spaced from the CA power rail. Each pair of CAs formed by one of the second and third color masks is separated by at least two pitches.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
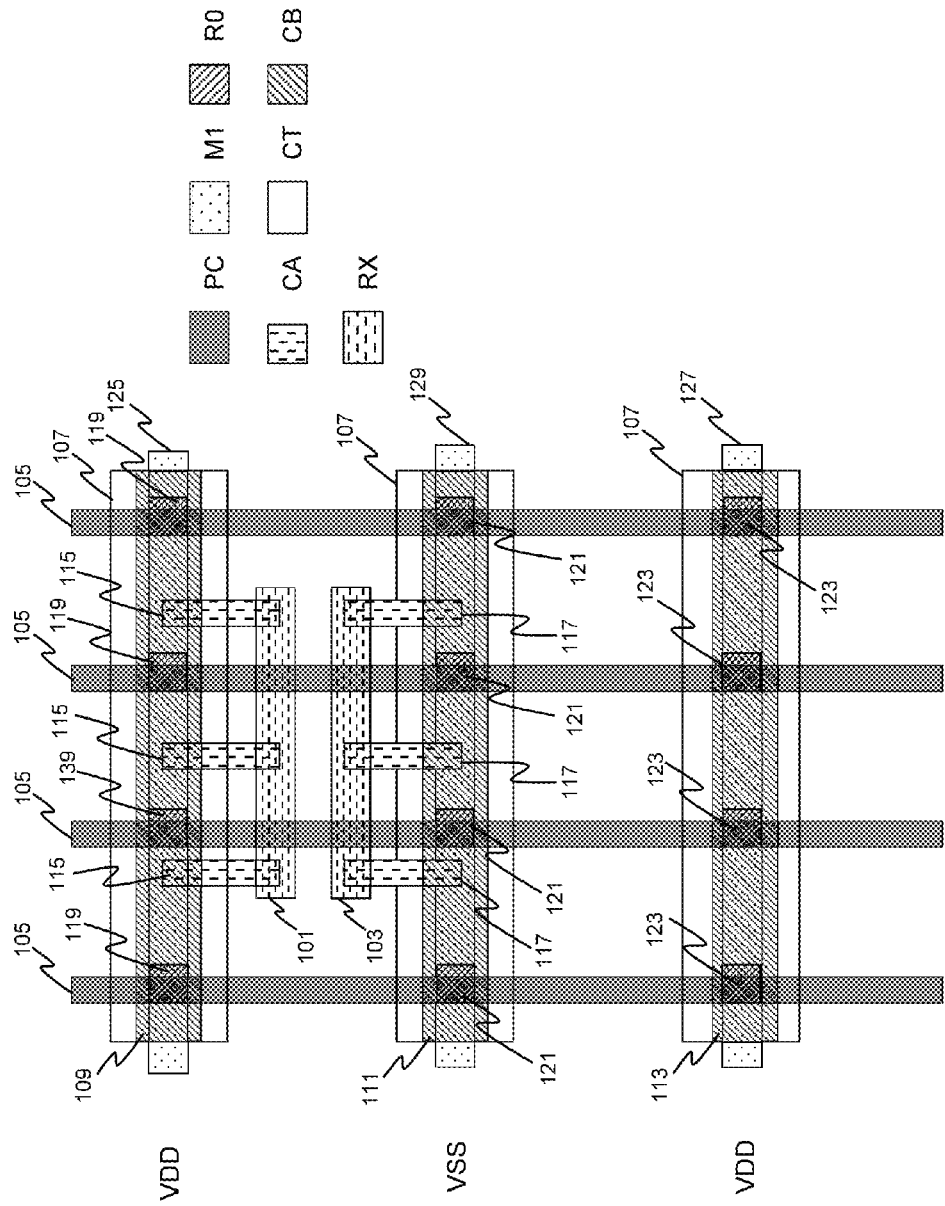
FIG. 1 schematically illustrates a background semiconductor device with a CB power rail.
Figure 2:
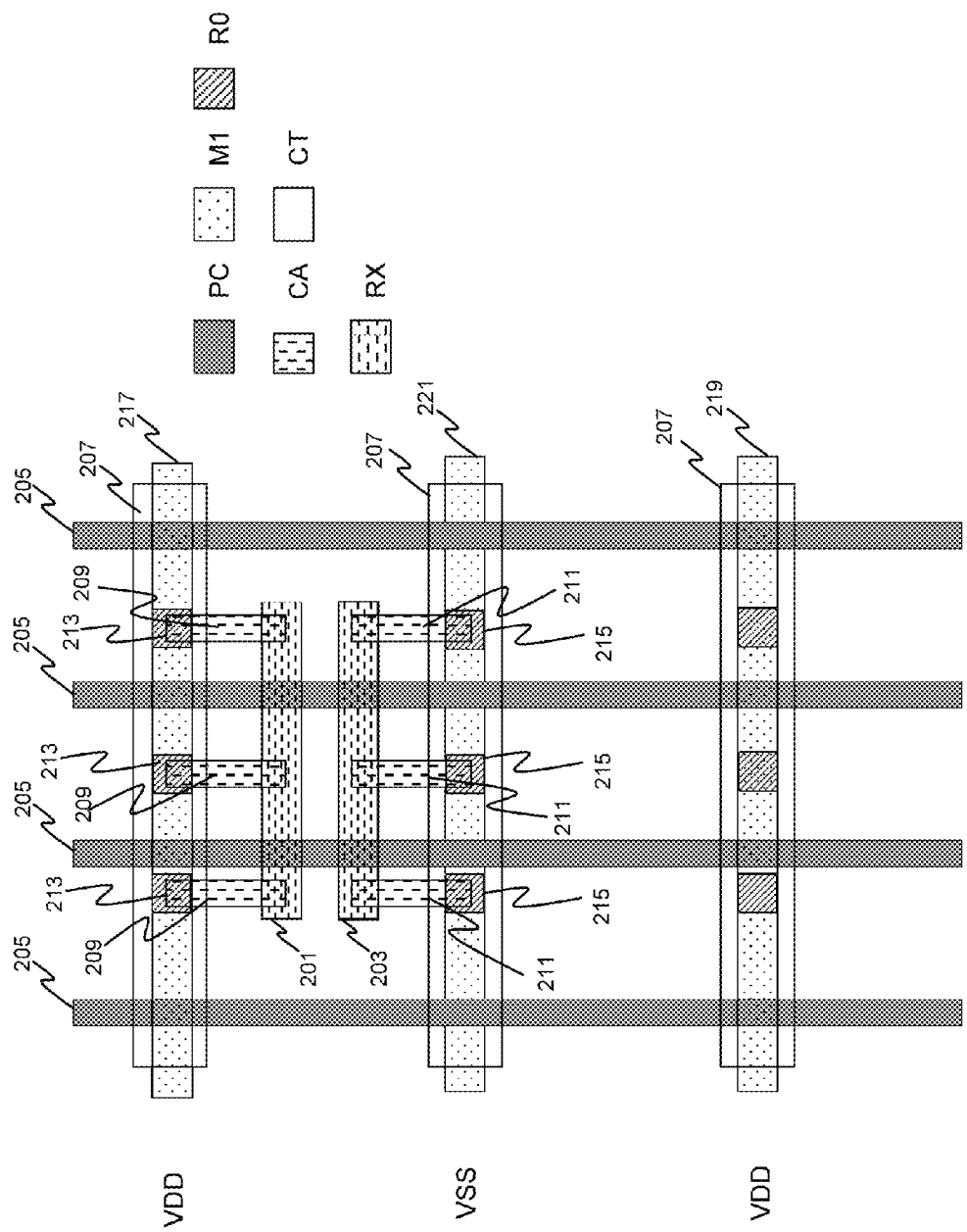
FIG. 2 schematically illustrates a background semiconductor device with a M1 power rail.
Figure 3:
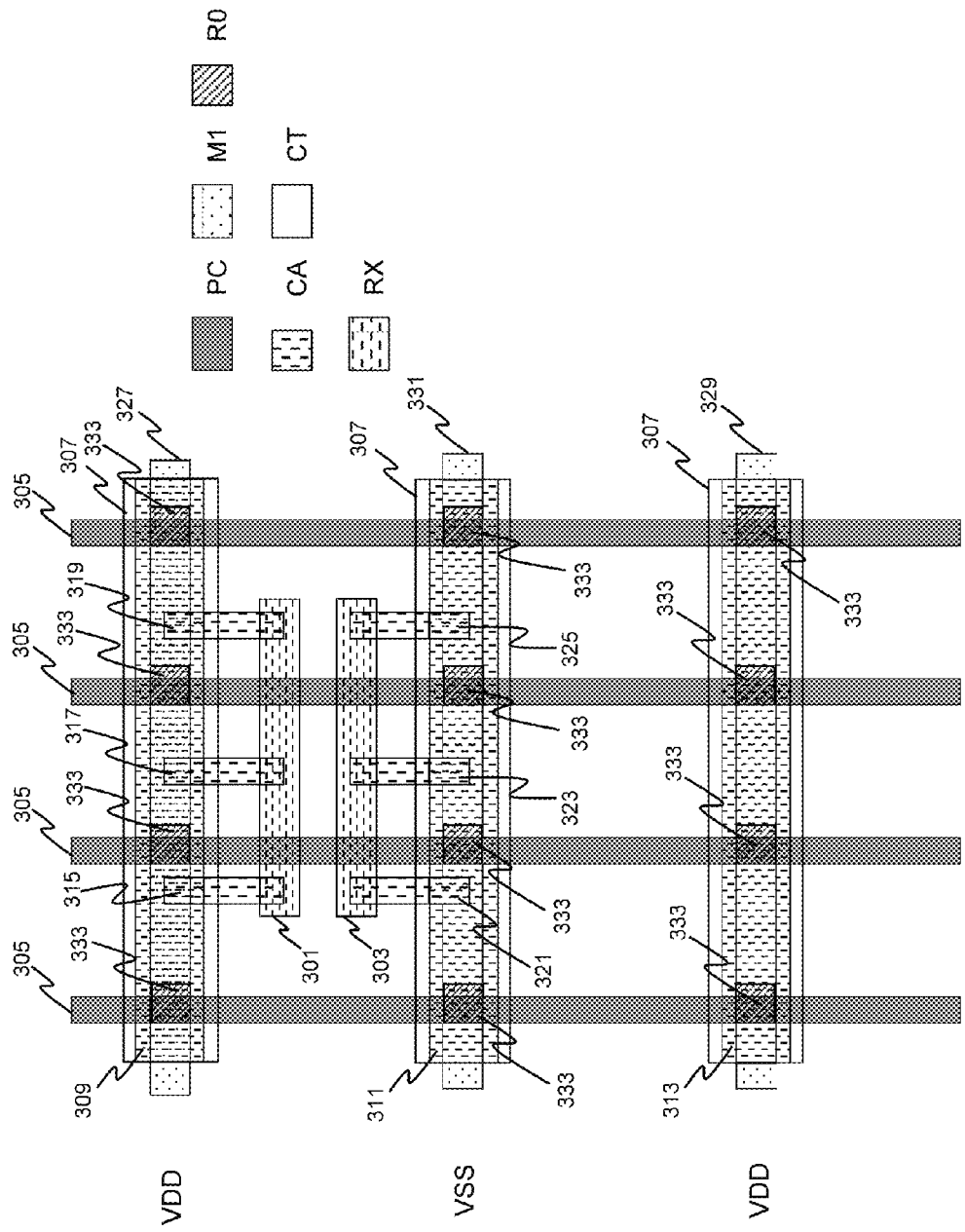
FIG. 3 schematically illustrates a semiconductor device with a CA power rail, in accordance with an exemplary embodiment of the present disclosure.

Adverting to FIG. 3, RX regions 301 and 303 are first formed on a semiconductor substrate (not shown for illustrative convenience). Vertical PCs 305 are then formed in a polysilicon layer of the substrate. Next, CTs 307 are formed over the PCs 305, i.e., between the PCs 305 and the subsequently formed horizontal diffusion CA power rails 309, 311, and 313, which are formed in an active layer of the substrate using a first color mask. More specifically, CTs 307 can be formed with a minimum width, e.g., 44 nm, because, unlike CBs, which connect to PCs, CA will never etch down to the PC thereby shorting CA to PC. Once the CA power rails 309 through 313 are formed, vertical CAs 315 through 325 are formed in the active layer using second and third color masks. Each pair of CAs formed by one of the second and third color masks, e.g., CAs 315 and 319, are separated by at least two pitches. Moreover, the vertical CAs 315 through 319 and 321 through 325 connect the CA power rails 309 and 311 with the RXs 301 and 303, respectively. Next, horizontal positive M1 power rails 327 and 329 (VDDs) and a horizontal negative M1 power rail 321 (VSS) are formed in an M1 layer of the substrate. Double patterned R0s 333 are then formed between the active and M1 layers of the substrate to connect the CA power rails 309 through 313 to the M1 power rails 327 through 331. More specifically, an R0, e.g., R0 333, is decomposed into $R0_{13}E1$ and $R0_{13}E2$, which become two separate masks.

Figure 4:
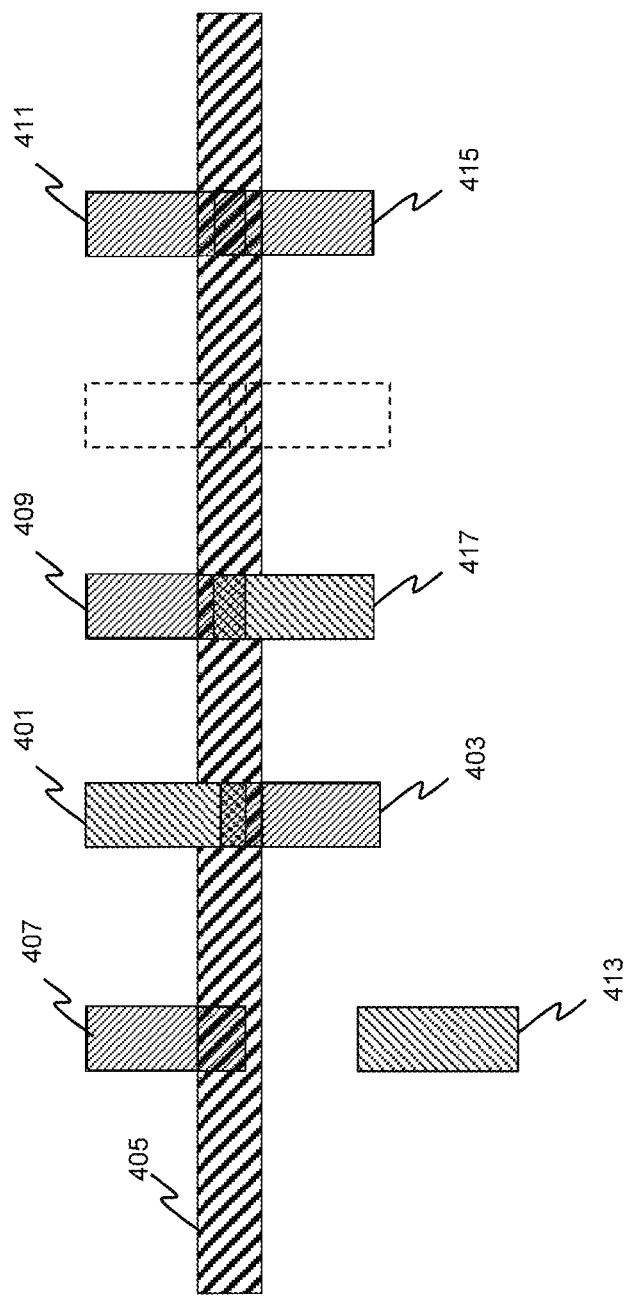
FIG. 4 schematically illustrates various CA situations that can arise at the boundary of two abutted cells, in accordance with an exemplary embodiment of the present disclosure.

As illustrated in FIG. 4, there are different possibilities that can arise when abutting two cells using the three mask decomposition process in accordance with embodiments of the present disclosure. First, a vertical CA 401 and a vertical CA 403 can be formed on opposite sides of the CA power rail 405, by the second and third color masks, respectively, distinct from the first color mask used to form the CA power rail 405, as depicted by the different patterns of the CAs 401 and 403. For CAs 401 and 403, a good overlap region between each CA and CA power rail 405 is needed to ensure connectivity, so the two CAs are stitched together on the CA power rail.

Second, pitch splitting is employed, alternating between the second and the third color mask, to maximize pitch density. As such, a vertical CA 407 can be formed two pitches away from a vertical CA 409, with 407 and 409 being formed by the same color mask, and CA 401 in between being formed by a different color mask. Similarly, CA 409 and CA 411 may be formed with the same color mask, by skipping a CA in between, as depicted by the dashed lines, thereby separating CAs 409 and 411 by two pitches.

Third, a CA 407 can be formed on one side of the CA power rail 405 by one of the second and third color masks, overlapping the CA power rail 405, and a CA 413 can be formed across the CA power rail 405 and by the other of the second and third color masks, separated from the CA power rail 413. By forming the two CAs by different color masks, the distance between them may be less than the critical distance for lithography. In addition, CAs 411 and 415 can be formed by the same color mask on opposite sides of CA power rail 405 and merged together into one shape. This may give rise to two CAs, e.g. 415 and 417, being formed by different color masks yet separated by two pitches.

The embodiments of the present disclosure can achieve several technical effects including achieving R0 redundancy and enabling the use of minimally wide CTs, which creates higher RX efficiency in the cell. In addition, the present disclosure eliminates lithography limitations, thereby affording more design freedom. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly in 14 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a horizontal diffusion contact (CA) power rail in an active layer of a semiconductor substrate using a first color mask;
   forming a plurality of vertical CAs in the active layer using second and third color masks, the vertical CAs connecting the CA power rail to at least one diffusion region on the semiconductor substrate, spaced from the CA power rail,
   wherein each pair of CAs formed by one of the second and third color masks are separated by at least two pitches; and
   wherein the first, second, and third color masks are of different colors and provide an indication of an acceptable design by avoiding same color space violations.

2. The method according to claim 1, further comprising:
   forming a horizontal M1 power rail in an M1 layer; and
   forming a plurality of vias connecting the CA power rail to the M1 power rail.

3. The method according to claim 2, further comprising:
   forming a plurality of vertical polysilicon gate electrodes in a polysilicon layer; and
   forming a cut mask between the polysilicon gate electrodes and the CA power rail.

4. The method according to claim 1, comprising forming vertical CAs on opposite sides of the CA power rail, wherein a first CA on one side of the CA power rail is formed by one of the second and third color masks, and a second CA, across the CA power rail from the first CA, is formed by the other of the second and third color masks.

5. The method according to claim 4, wherein the first and second CAs overlap both the CA power rail and also each other.

6. The method according to claim 4, comprising forming a third CA two pitches away from the first CA and a fourth CA two pitches away from the second CA, with no CAs in between, wherein the third and fourth CAs are formed by the same color mask.

7. The method according to claim 4, comprising forming a third CA on one side of the CA power rail by one of the second and third color masks, overlapping the CA power rail, and forming a fourth CA, across the CA power rail from the third CA, by the other of the second and third color masks, separated from the CA power rail.

8. A method comprising:
   forming first and second horizontal diffusion regions (RX) in an RX layer of a semiconductor substrate within a cell;
   forming a first, second, third, and fourth vertical polysilicon gate electrodes (PCs), evenly spaced in a PC layer of the semiconductor substrate;
   forming a horizontal positive power rail (VDD) in a metal layer (M1) of the semiconductor substrate;
   forming a horizontal negative power rail (VSS) in the M1 layer;
   forming first and second horizontal diffusion contact (CA) power rails in a CA layer of the semiconductor substrate, above VDD and VSS, respectively;
   forming a plurality of pairs of vertical CAs in the CA layer, each vertical CA attached to an RX region, evenly spaced between VDD and VSS;
   forming a plurality of vias (R0) connecting the first and second horizontal CA power rails with the M1 layer, each R0 above a vertical PC and within a horizontal CA power rail; and forming a first and a second horizontal gate cut region (CT) between the PCs and the first and second horizontal CA power rails, respectively, wherein the horizontal CA power rails and the vertical CAs are decomposed into a first color mask and second and third color masks, respectively, and wherein the first, second, and third color masks are of different colors and provide an indication of an acceptable design by avoiding same color space violations.

9. The method according to claim 8, comprising forming the first and second RX evenly spaced between VDD and VSS.

10. The method according to claim 8, comprising forming vertical CAs on opposite sides of the CA power rail, wherein a first CA is formed on one side of the CA power rail by one of the second and third color masks, and a second CA is formed across the CA power rail from the first CA by the other of the second and third color masks.

11. The method according to claim 10, wherein the first and second CAs overlap both the CA power rail and each other.

12. The method according to claim 10, comprising forming a third CA two pitches away from the first CA and a fourth CA two pitches away from the second CA, with no CAs in between, wherein the third and fourth CAs are formed by the same color mask.

13. The method according to claim 10, comprising forming a third CA by one of the second and third color masks on one side of a CA power rail, overlapping the CA power rail, and forming a fourth CA by the other of the second and third color masks across from the third CA, separated from the CA power rail.

* * * * *